US006534967B1

(12) United States Patent
Weggel

(10) Patent No.: US 6,534,967 B1
(45) Date of Patent: Mar. 18, 2003

(54) DUAL TOTEM CURRENT SENSOR FOR MEASURING LOAD CURRENT IN AN H-BRIDGE POWER STAGE

(75) Inventor: Craig R. Weggel, Willow Grove, PA (US)

(73) Assignee: MTS Systems Corporation, Eden Prairie, MN (US)

(*) Notice: Subject to any disclaimer, the term of this patent is extended or adjusted under 35 U.S.C. 154(b) by 138 days.

(21) Appl. No.: 09/677,395

(22) Filed: Sep. 29, 2000

Related U.S. Application Data
(60) Provisional application No. 60/235,003, filed on Sep. 25, 2000.

(51) Int. Cl.[7] .............................................. G01R 29/08
(52) U.S. Cl. ..................................... 324/127; 324/76.11
(58) Field of Search ............................ 324/127, 76.11, 324/76.75, 725, 726, 610; 363/13, 34, 50, 132

(56) References Cited

U.S. PATENT DOCUMENTS

| 4,365,422 A | | 12/1982 | Kawaguchi ...................... 34/1 |
|---|---|---|---|
| 4,404,623 A | | 9/1983 | Jourdan ......................... 363/56 |
| 4,542,440 A | | 9/1985 | Cheety et al. ................ 361/111 |
| 4,584,635 A | | 4/1986 | MacInnis et al. ............. 363/25 |
| 4,717,889 A | * | 1/1988 | Engelmann .................. 323/301 |
| 4,873,616 A | * | 10/1989 | Fredrick et al. ......... 315/DIG. 7 |
| 4,912,396 A | | 3/1990 | Groenenboom ........... 324/117 R |
| 4,937,725 A | * | 6/1990 | Dhyanchand et al. ........ 363/132 |
| 5,070,292 A | | 12/1991 | Goff ............................. 318/811 |
| 5,081,409 A | | 1/1992 | Goff ............................. 318/811 |
| 5,379,209 A | | 1/1995 | Goff ............................. 363/132 |
| 5,629,616 A | | 5/1997 | Weggel ......................... 324/127 |

FOREIGN PATENT DOCUMENTS

| DE | 332737 | 2/1921 |
|---|---|---|
| DE | 0 631 145 A | 12/1994 |
| GB | 2202338 A | 9/1988 |

* cited by examiner

Primary Examiner—N. Le
Assistant Examiner—Vincent Q. Nguyen
(74) Attorney, Agent, or Firm—Westman, Champlin & Kelly, P.A.

(57) ABSTRACT

A dual totem (or H-bridge) power stage has four power devices, at least two of which are controlled by pulse width modulation (PWM) control signals to change current paths of the load current flowing through the driven load. A current sensor for measuring the load current includes a transformer having a secondary winding having a number N of turns, and a primary winding. The primary winding has four separate primary winding sections each coupled in series with a different one of the four power devices of the dual totem power stage. Different ones of the four primary winding sections have different numbers of turns such that different turns ratios result between the primary winding and the secondary winding for different current paths, thus generating a modulated signal on the secondary winding. The modulated signal is demodulated for accurate representation or reproduction of the current flowing through the load.

16 Claims, 5 Drawing Sheets

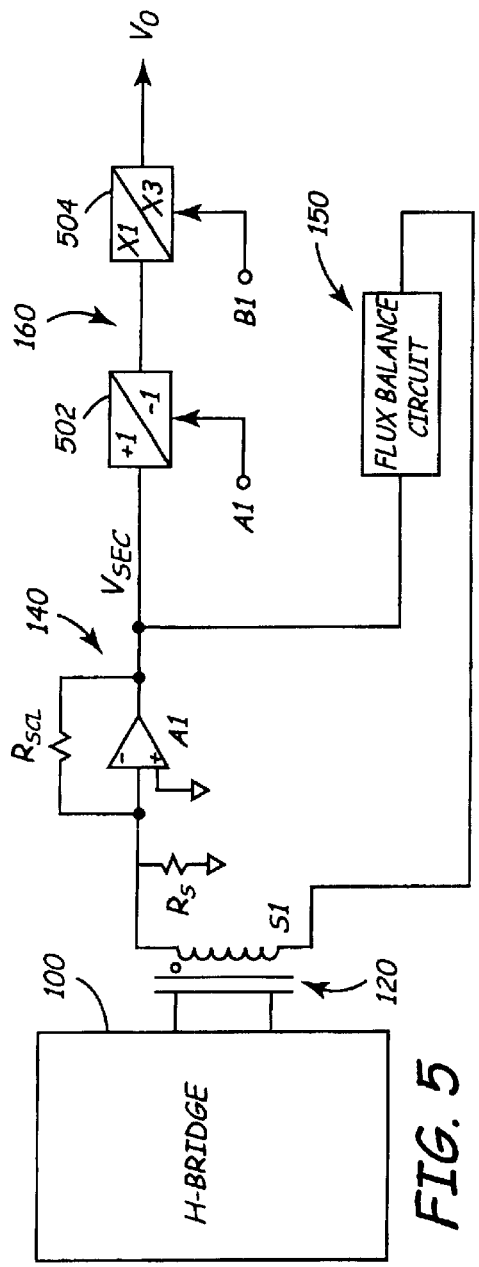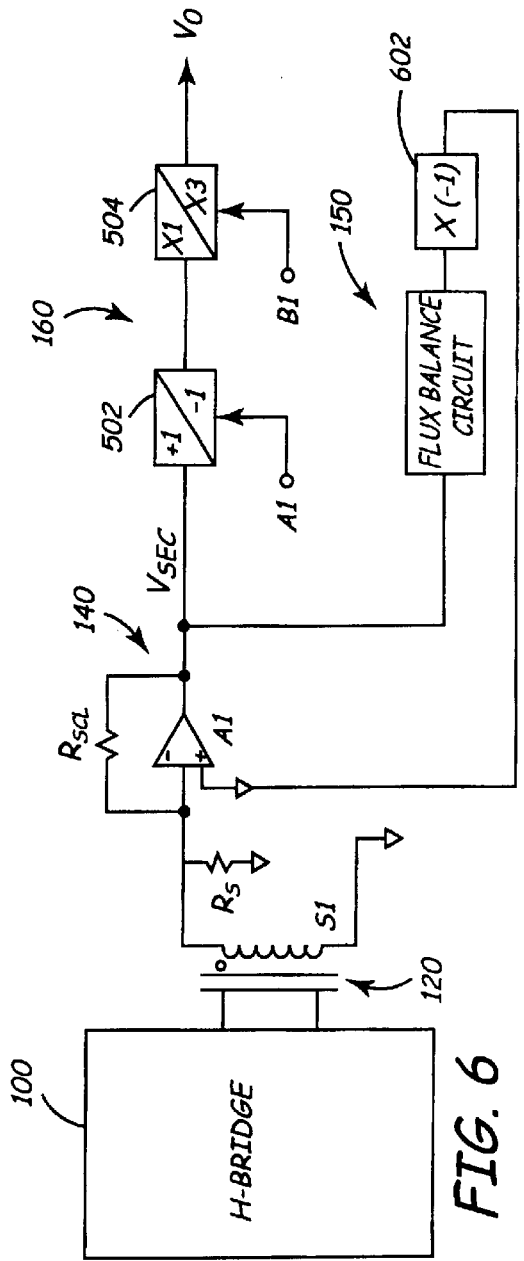
FIG. 5
FIG. 6

US 6,534,967 B1

DUAL TOTEM CURRENT SENSOR FOR MEASURING LOAD CURRENT IN AN H-BRIDGE POWER STAGE

The present application claims the benefit of earlier filed U.S. Provisional Application No. 60/235,003, filed on Sep. 25, 2000, entitled "DUAL TOTEM CURRENT SENSOR FOR MEASURING LOAD CURRENT IN AN H-BRIDGE POWER STAGE", which is herein incorporated by reference in its entirety.

CROSS-REFERENCE TO RELATED APPLICATIONS

Reference is made to co-pending and commonly assigned U.S. patent application Ser. No. 09/443,825 filed on Nov. 19, 1999 now U.S. Pat. 6,320,370 entitled "CIRCUIT WITH IMPROVED DYNAMIC RESPONSE FOR MEASURING CURRENT IN PULSE WIDTH MODULATED AMPLIFIERS", which is herein incorporated by reference in its entirety.

BACKGROUND OF THE INVENTION

The present invention relates to the field of current measurement, particularly in the context of pulse-width-modulated (PWM) circuits. More specifically, the invention relates to a circuit which provides accurate measurement of current flowing through a load for a dual totem (H-bridge) power stage, while maintaining galvanic isolation between the measurement circuit and the load.

Examples of PWM circuits are shown in U.S. Pat. Nos. 5,070,292, 5,081,409, 5,379,209, and 5,365,422. The disclosures of these patents are hereby incorporated by reference. These patents provide examples of circuits in which a series of pulses is used to control electronic switches which selectively connect a power supply to a load. The load can be an electric motor, or a coil used to produce a magnetic field, or some other load.

In PWM circuits of the types described in the above-cited patents, it is often necessary to monitor the current flowing through the load, either for purposes of overcurrent protection, or to control another circuit based on the measured current in the load, or for other reasons. Direct measurement of load current is undesirable because it requires the insertion of an inductance or a resistance into the circuit being monitored. Preferably, the current measurement technique will maintain galvanic isolation, i.e. insuring that no current flows directly between the load and the measuring circuit.

However, in the prior art, there are few techniques for measuring load current in a PWM circuit while maintaining galvanic isolation. While the load can be coupled, through a transformer, to a conventional circuit for current measurement, the accumulation of magnetic flux in the transformer core accentuates the nonlinearity of the transformer and introduces inaccuracy into the final measurement. A solution to this problem is to use a larger transformer, which is less likely to experience core saturation and which therefore provides a greater range over which the transformer response is relatively linear. However, using a larger transformer has the disadvantage of requiring a larger space, and it may also be unacceptably expensive.

In some current measurement circuits, during times in which the sensed load current is changing in response to PWM control signals, the output of the current measurement circuit may not represent the actual load current with the level of accuracy desired. For example, in some current measurement circuits, the load current indicative output can be erroneous by an amount proportional to the rate of change of the load current.

In prior art current measurement circuits for measuring the load current through a dual totem power stage (an H-bridge), two transformers were employed, one for each totem of the H-bridge. Likewise, the prior art required two flux balance circuits and two decommutation circuits, one for each totem. This presented numerous disadvantages, including an increased parts count, higher material and assembly costs, and increased size of the current sensor.

SUMMARY OF THE INVENTION

A dual totem (or H-bridge) power stage has four power devices (for example four switches, or two switches and two diodes in the case of a two quadrant bridge), at lest some of which are controlled by pulse width modulation (PWM) control signals to change voltage presented across the load with the purpose of affecting the level or polarity of current flowing through the driven load. A current sensor for measuring the load current includes a transformer having a secondary winding having a number N of turns, and a primary winding. The primary winding has four separate primary winding sections each coupled in series with a different one of the four power devices of the dual totem power stage. Different ones of the four primary winding sections have different numbers of turns such that different turns ratios result between the primary winding and the secondary winding for different current paths, thus generating a modulated signal on the secondary winding. Measurement circuitry coupled to the secondary of the transformer demodulates the modulated signal on the secondary winding to provide a load current output indicative of a level of current through the load. Demodulation of the modulated signal occurs by applying different gains to the modulated signal as a function of the turns ratio resulting from a particular current path.

BRIEF DESCRIPTION OF THE DRAWINGS

FIG. 5 is a schematic and block diagram illustrating a first alternate embodiment of the present invention.

FIG. 6 is a schematic and block diagram illustrating a second alternate embodiment of the present invention.

DETAILED DESCRIPTION OF THE PREFERRED EMBODIMENTS

The present invention includes a circuit which provides continuous monitoring of a sensed load current in a dual totem or H-bridge PWM circuit, under both static and dynamic conditions. A dual totem power stage includes four power devices, such as switches, semiconductor transistors or diodes, or mechanical devices such as relays. While dual totem power stages are typically described with reference to four separate switches (two per totem), as described herein the phrase dual totem stage is intended to also represent circuits of this type having one switch and one diode (or other similarly functioning device) per totem.

By providing a means to continuously monitor the sensed load current under both static and dynamic conditions, a more accurate representation of the actual load current can be obtained. The circuit includes both a new primary winding configuration for the transformer which couples to the dual totem power stage, and a new current decommutation circuit for reconstructing or decoding the signals from the transformer secondary into a signal which accurately represents the load current flowing through the H-bridge. The decommutation circuitry performs gain variation and inversion functions.

Figure 1:
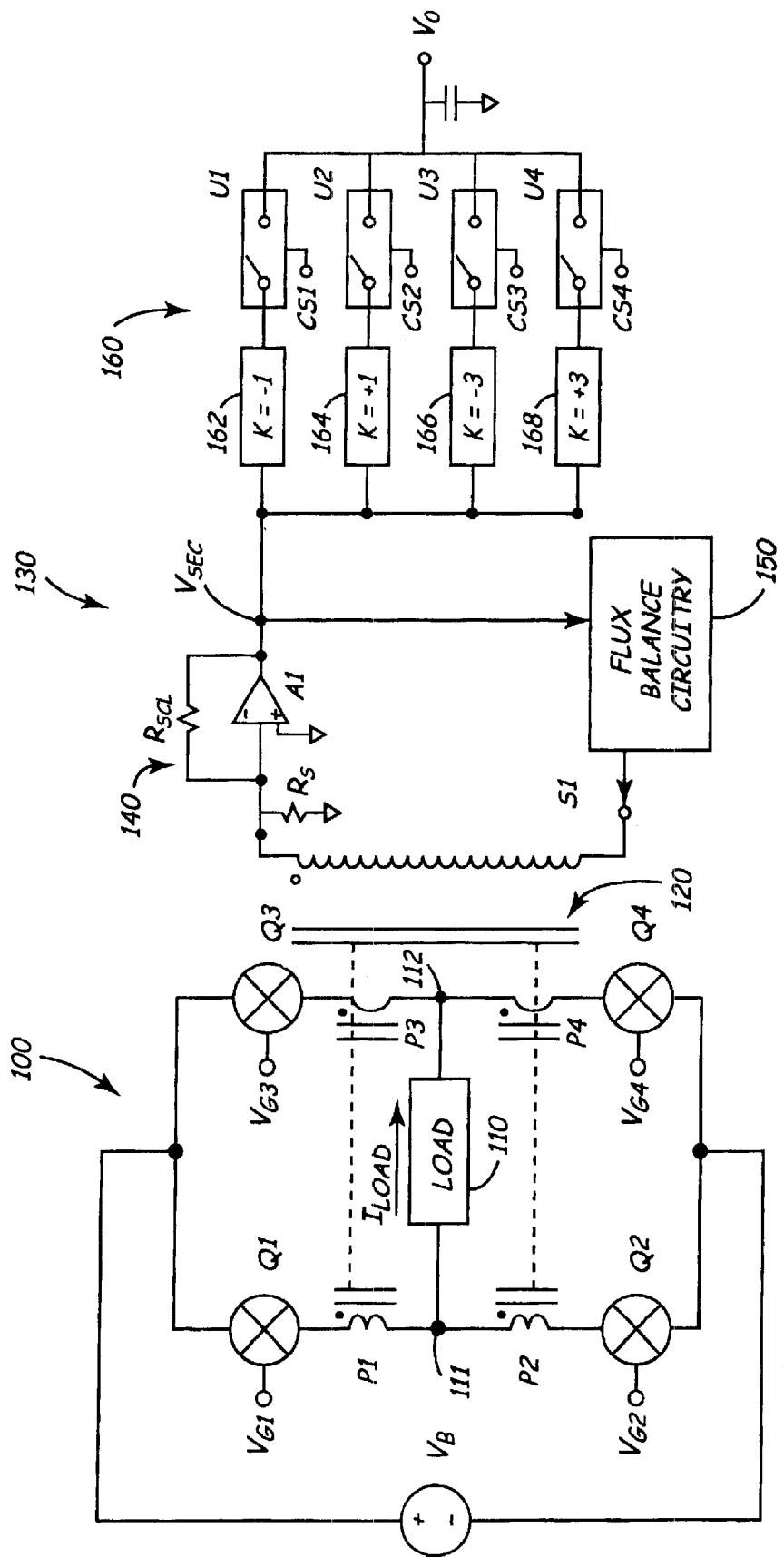
FIG. 1 is a schematic and block diagram of a current measurement circuit for measuring load current in a dual totem power stage according to the present invention.

The left-hand portion of FIG. 1 shows a pulse width modulation (PWM) dual totem power stage (H-bridge) circuit 100 which applies current $I_{LOAD}$ to a load 110. The dual totem circuit 100 includes switches Q1, Q2 in a first totem, and switches Q3 and Q4 in a second totem configured as shown. These switches can be other types of power devices. For example, Q2 and Q3 can be diodes. Although all of Q1, Q2, Q3 and Q4 are described below as being switches, the description is also applicable to embodiments in which some of these power devices are other types of devices. The power supply voltage $V_B$ is applied across the dual totem power stage 100 also as shown.

Transformer 120 is connected between dual totem power stage circuit 100 and a measurement circuit 130. Transformer 120 provides an isolation boundary between these two circuits. As shown in FIG. 1, the primary windings of transformer 120 are included in series with the switches in the current paths provided by dual totem power stage circuit 100. There are four primary windings in transformer 120, namely winding P1 connected between switch Q1 and a first node or side 111 of load 110, winding P2 connected between switch Q2 and the first node 111 of load 110, winding P3 connected between switch Q3 and a second node 112 of load 110, and winding P4 coupled between switch Q4 and the second node 112 of load 110. The dots shown near primary windings P1, P2, P3 and P4 in FIG. 1 indicate positive current directions relative to secondary winding S1 of transformer 120.

Switch Q1 is controlled by voltage $V_{G1}$ to thereby control conduction of current through the switch and through primary winding P1. Switch Q2 is controlled by voltage $V_{G2}$ to thereby control conduction of current through switch Q2 and primary winding P2. Switch Q3 is controlled by voltage $V_{G3}$ to thereby control conduction of current through switch Q3 and primary winding P3. Similarly, switch Q4 is controlled by voltage $V_{G4}$ to thereby control conduction of current through switch Q4 and primary winding P4. In embodiments where switches Q2 and Q3 are other types of non-switching power devices such as diodes, control signals $V_{G2}$ and $V_{G3}$ can be omitted.

The present invention includes the use of a single transformer 120 to provide current feedback from the dual totem power stage while providing full short-circuit protection for both totems (Q1,Q2 and Q3,Q4). A significant difference between the present invention and the prior art is the use of the single transformer 120, particularly with a new primary winding configuration. In the embodiment shown in FIG. 1, each of the four primary windings P1, P2, P3 and P4 are configured with either one or two turns to provide an encoded signal on the secondary S1 of the transformer. The resulting signal on the secondary of the transformer is fed into flux cancellation circuit 140, and ultimately into flux balance circuitry 150 and decommutation circuitry 160. The secondary S1 of transformer 120 has a number N of turns, which is typically between one hundred and several thousand, in order to take a relatively large load current waveform and to convert it to a smaller amplitude current waveform.

In a typical mode of operation of dual totem power stage 100, there are four phases of modulation. While other phases are possible, the following four phases of modulation serve to demonstrate the concepts of the invention. In a first phase of modulation which results in a first current path for the load current $I_{LOAD}$ signals $V_{G1}$ and $V_{G4}$ are at high logic levels causing switches Q1 and Q4 to conduct. Current flows through switch Q1, then through primary P1, then through load 110, then through primary P4, and finally through switch Q4. In this instance, the two turns of primary P1 are added to the single turn of primary P4, for a total of three primary turns in a first direction. This results in a signal on secondary S1 having an amplitude which is representative of three times the actual amplitude of the load current $I_{LOAD}$. In other words, the turns ratio from the primary to the secondary is +3:N.

A typical second phase of modulation which provides a second current path through the load is introduced when signals $V_{G1}$ and $V_{G3}$ are high, causing switches Q1 and Q3 to conduct current. In this phase current flows through switch Q1, primary P1, load 110, primary P3 and finally through switch Q3. This results in a total of two turns in the first direction from primary P1 and one turn in the opposite direction from primary P3. Therefore, the net turns ratio between the primary and secondary is +1:N. Thus, the result is a secondary signal amplitude which is representative of one times the actual amplitude of the load current $I_{LOAD}$.

A typical third phase of modulation which provides a third current path through load 110 is introduced when signals $V_{G2}$ and $V_{G3}$ are at the high logic level, causing switches Q2 and Q3 to conduct current. In this phase of operation, current flows through switch Q2, then through primary P2 and load 110, then through primary P3 and finally through switch Q3. This results in a total of two turns in the second direction (the direction opposite the first direction described above with reference to the first and second phases of operation) from primary P2 and one turn in the second direction from primary P3. Therefore, the net turns ratio between the primary and secondary of transformer 120 is −3:N. This phase of modulation would typically occur only if the level of the load current was to be decreased, or if a negative load current existed.

A typical fourth phase of modulation which provides a fourth current path through the load is introduced when signals $V_{G2}$ and $V_{G4}$ are at the high logic level, causing switches Q2 and Q4 to conduct current. In this phase, current flows through switch Q2 and primary P2, then through load 110, and finally through primary P4 and switch Q4. This results in a total of two turns in the second direction from primary P2 and one turn in the first or opposite direction from primary P4. Therefore, the net turns ratio between the primary and secondary is −1:N. Decommutation or decoding of the signal provided on secondary S1 of transformer 120 during the different phases of operation is discussed below in greater detail. Also, while primary portions P1 and P2 are described as having two turns and primary portions P3 and P4 are described as having one turn, other numbers of turns can be used. Further, it is not essential that primaries P1 and P2 have the same number of turns or that primaries P3 and P4 have the same number of turns. However, doing so can make demodulation less complex.

Current measurement circuit 130 includes flux cancellation circuit 140, flux balance circuit 150 and demodulator or decommutation circuit 160. Flux cancellation circuit 140 includes amplifier A1 and resistors $R_S$ and $R_{SCL}$. Resistor $R_S$ is a shunt resistor which lowers the slew rate requirement or criticality of amplifier A1. With the non-inverting input of amplifier A1 grounded, amplifier A1 generates a voltage across resistor $R_{SCL}$ which tends to maintain a zero voltage across secondary S1 of transformer 120, and thus circuit 140 acts to cancel flux in the secondary of the transformer. The output $V_{SEC}$ of amplifier A1 is a voltage signal representative of the current in the secondary winding S1 of the transformer. More specifically, the magnitude of the voltage at the output of amplifier A1 is indicative of the magnitude of the current flowing through load 110.

Since the amplifier A1 applies a voltage across the secondary S1 which tends to cancel the current in the secondary, the magnetic flux in the transformer core tends to be near zero. However, since there is always a finite amount of error in the signal generated by amplifier A1, used to produce an opposing current in secondary winding, the magnetic flux in the transformer core is not completely cancelled. Moreover, a DC component in the signal flowing through the primary winding of the transformer may be present. The lack of complete flux cancellation will result in "flux creepage" in the transformer core. Since flux is the integral, over time, of the sum of the induced voltages across all phases of the transformer, as shown by Faraday's law, or, in other words, the average value of volt-seconds across all phases of the transformer is nonzero, the flux will increase or decrease, depending on the polarity of the net voltage, and will continue to increase or decrease for as long as there is an imbalance in volt-seconds or until the core is saturated. The latter problem is solved by flux balance circuitry 150 described later.

Measurement circuit 130 also includes demodulation or decommutation circuit 160 which is adapted to reconstruct the encoded signals on secondary S1 of transformer 120 resulting from the primary winding configuration utilized to encode load current signals in circuit 100. Circuit 160 includes four gain stages 162, 164, 166 and 168, each of which is adapted to apply a different gain and polarity to signal $V_{SEC}$. Gain stage 162 is adapted to apply a gain of –1, gain stage 164 is adapted to apply a gain of +1, gain stage 166 is adapted to apply a gain of –3, and gain stage 168 is adapted to apply a gain of +3. In the general embodiment illustrated in FIG. 1, four separate switches U1, U2, U3 and U4 provided in circuit 160 are controlled respectively by inputs CS1, CS2, CS3 and CS4 such that output $V_o$ is a version of signal $V_{SEC}$ having the appropriate gain applied. In this embodiment, typically only one of the switches are closed at any one time. Determination of the appropriate gain applied by circuit 160 can be as follows.

To reconstruct the current signals, when the phase of operation is such that the turns ratio is +3:N, the switches of circuit 160 are controlled such that output signal $V_o$ is indicative of $V_{SEC}$ with an applied gain of +1 (i.e., gain stage 164 and a closed switch U2 couple signal $V_{SEC}$ to the output). When the phase of operation is such that the turns ratio is +1:N, gain stage 168 and switch U4 are used to couple signal $V_{SEC}$ to the output in order to apply a demodulation gain of +3 to signal $V_{SEC}$ in order to bring it in line with pulses from the first stage of operation.

In phases of operation in which the switches of circuit 100 are controlled such that the effective turns ratio is –3:N, gain stage 162 and switch U1 couple signal $V_{SEC}$ to the output in order to apply a demodulation gain of –1. In phases of operation in which the switches of circuit 100 are controlled to establish a turns ratio of –1:N, gain stage 166 and switch U3 are used to apply a gain of –3 to signal $V_{SEC}$.

Figure 2:
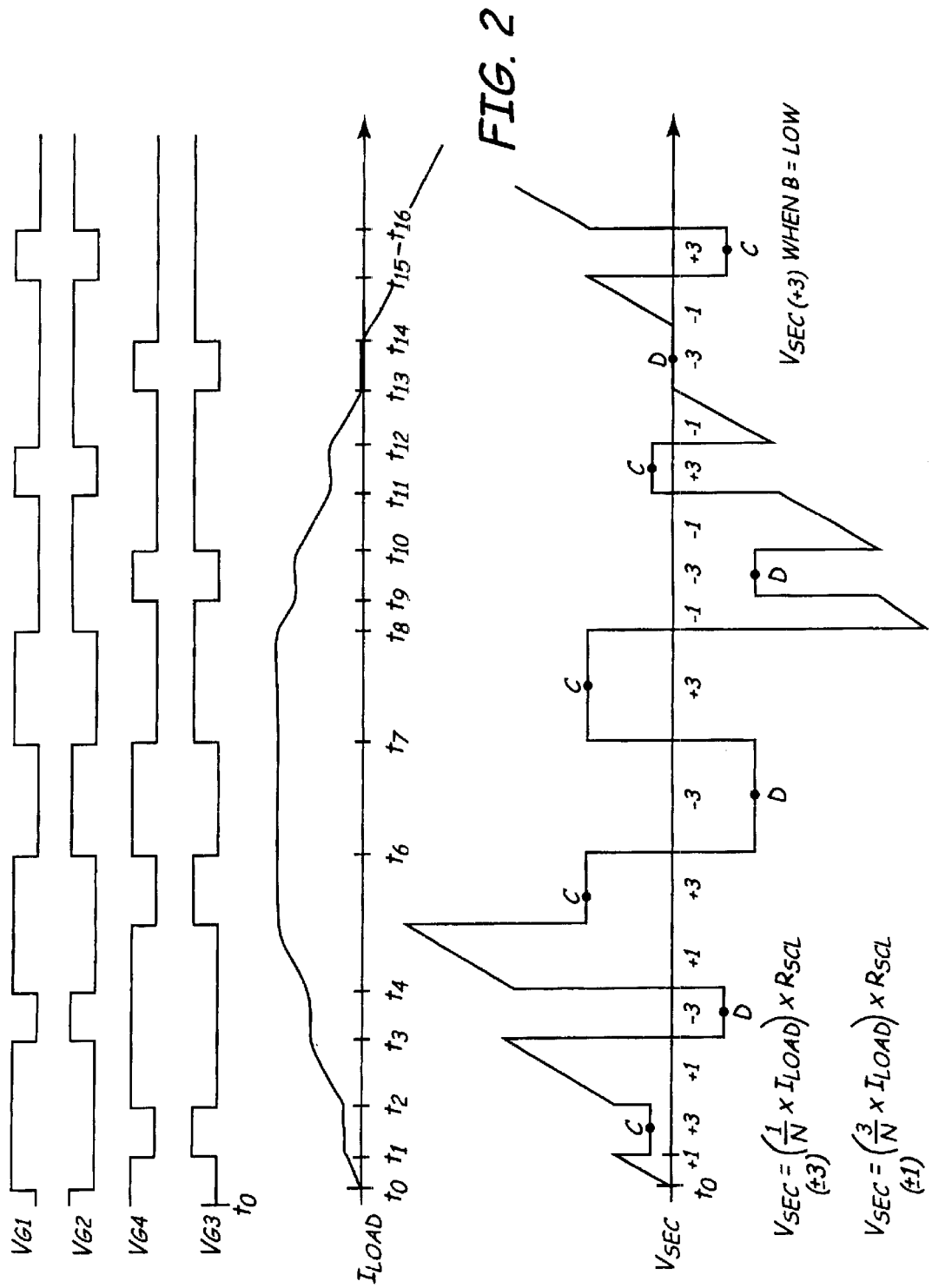
FIG. 2 is a timing diagram illustrating operation of the circuit shown in FIG. 2.

FIG. 2 is a timing diagram which illustrates the PWM control signals $V_{G1}$, $V_{G2}$, $V_{G3}$ and $V_{G4}$ in each of these four phases of operation in accordance with a first embodiment of the invention. Also illustrated in FIG. 2 are plots demonstrating the load current $I_{LOAD}$ and the voltage signal $V_{SEC}$ which results from the timing of the control signals as illustrated. On the plot at the bottom of FIG. 2 illustrating the voltage waveform for voltage signal $V_{SEC}$, the demodulation gain to be applied by circuit 160 is indicated for each different time period illustrated.

Figure 3:
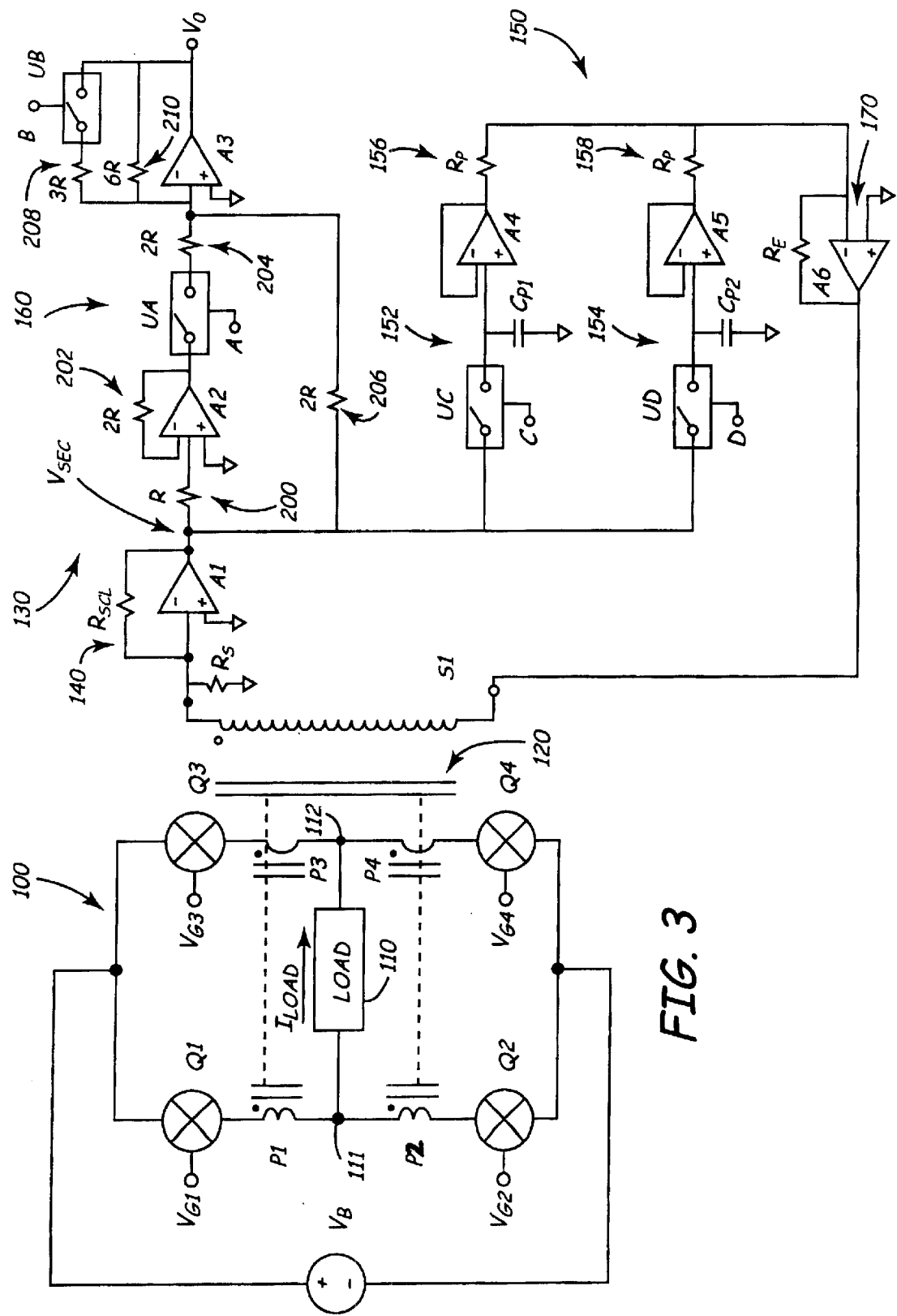
FIG. 3 is a schematic diagram of a current measurement circuit for measuring load current in a dual totem power stage in accordance with a first more particular embodiment of the present invention.

Shown in FIG. 3 is a more detailed embodiment of circuit 130 in which a particular implementation of flux balance circuitry 150 is shown. Also, a first more particular embodiment of demodulation circuit 160 which uses only two switches is shown.

Referring first to demodulation circuit 160 shown in FIG. 3, in this particular embodiment, the demodulation circuit includes first and second amplifiers A2 and A3. First amplifier A2 includes resistors 200 and 202 configured such that amplifier A2 functions as an inverting amplifier. Resistor 200 has a resistance of R, while resistor 202 has a resistance of 2R. The output of amplifier A2 can be selectively provided through switch UA and resistor 204 (also having a value of 2R) to the inverting input of amplifier A3. Resistor 206, also having a resistance of 2R, is connected in parallel with these components between output $V_{SEC}$ of amplifier A1 and the inverting input of amplifier A3. Resistor 210 having a resistance of 6R, is connected between the inverting input of amplifier A3 and output $V_o$. Resistor 208 having a resistance of 3R is also selectively coupled by switch UB (under the control of input signal B) between the inverting input to amplifier A3 and output $V_0$.

Figure 4:
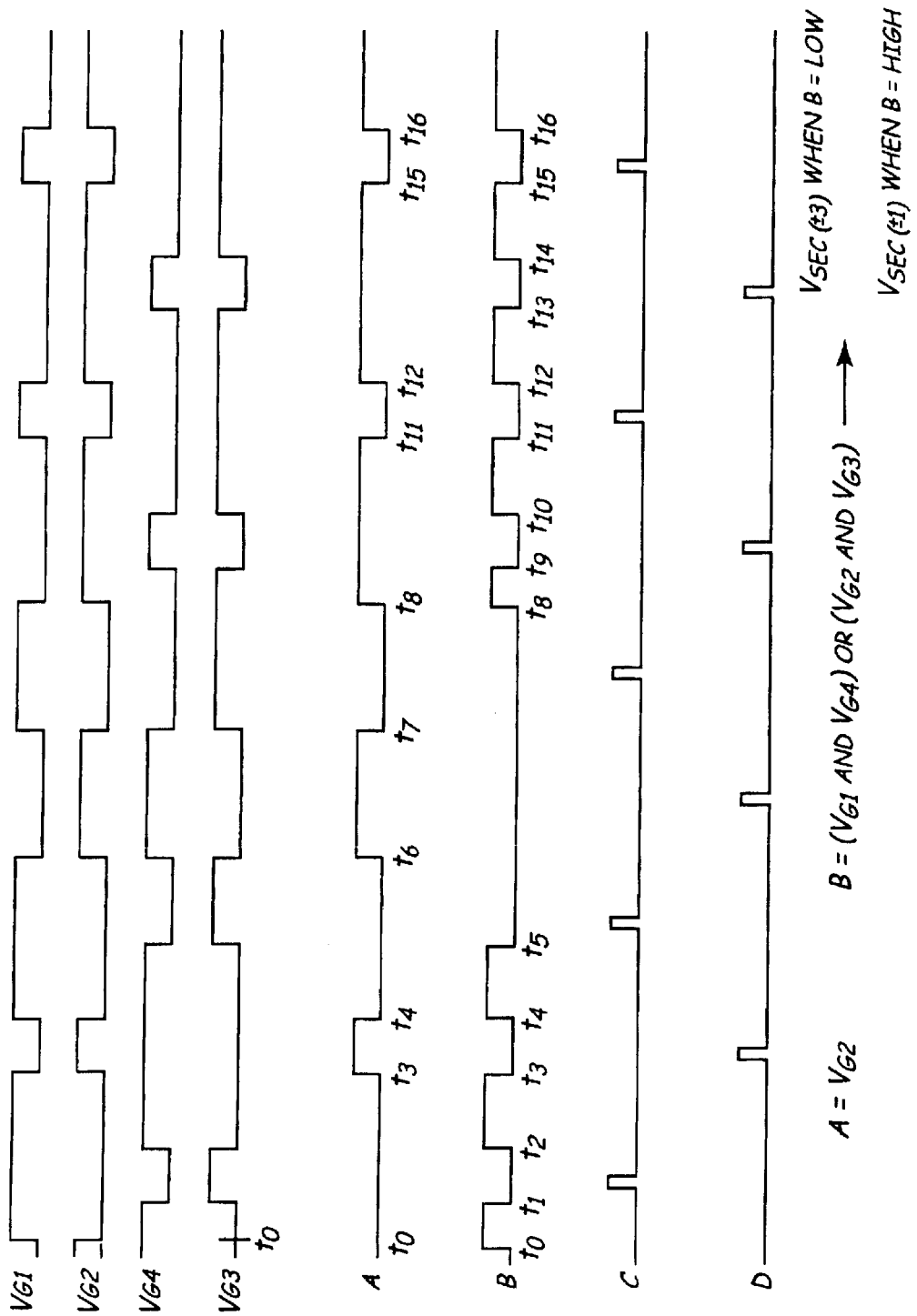
FIG. 4 is a timing diagram which illustrates the logic used to control the demodulation switches of the circuit shown in FIG. 3 in accordance with an embodiment of the present invention.

Signals A and B are control signals for controlling switches UA and UB. When they are at a high logic level, the corresponding switch is closed. However, control signals A and B can be inverted if normally closed switches are used instead of normally open switches. FIG. 4 illustrates a timing diagram which shows the timing of control signals A and B relative to PWM control signals $V_{G1}$, $V_{G2}$, $V_{G3}$ and $V_{G4}$ in one embodiment. Using the illustrated control signal patterns for control signals A and B during the various phases of operation of circuit 100 (as controlled by control signals $V_{G1}$, $V_{G2}$, $V_{G3}$ and $V_{G4}$) switches UA and UB can be controlled such that circuit 160 applies the appropriate gain and polarity (i.e., +1, –1, +3, or –3 as described above) to voltage signal $V_{SEC}$.

Referring now to circuit 150 in FIG. 3, in one embodiment the second flux cancellation mechanism includes two identical peak detection circuits 152 and 154 for monitoring the peak excursions of the voltage signal $V_{SEC}$ at the output of amplifier A1. In an exemplary embodiment, circuit 152 includes switch UC, capacitor $C_{P1}$, amplifier A4 and resistor 156 having a value of $R_P$. In this exemplary embodiment, the second circuit 154 includes switch UD, capacitor $C_{P2}$, amplifier A5 and resistor 158 having a value of $R_P$. Switch UC is controlled by signal C. Switch UD is controlled by signal D. Signals C and D are derived from the PWM signals $V_{G1}$ and $V_{G2}$ used to drive the H-bridge PWM circuit 100, and are illustrated for one example embodiment in FIG. 4. They are also shown, relative to the widths of pulses in signal $V_{SEC}$, in the bottom waveform of FIG. 2.

In a first embodiment, signal C can be the same as $V_{G1}$ and signal D can be the same as $V_{G2}$, i.e. the signals which drive the switches in circuit 100 to apply current to the load. However, it is preferable in some embodiments to introduce a time delay, relative to the rising edges of signals $V_{G1}$ and $V_{G2}$, to the switch control signals C and D. Also, in some embodiments signals C and D have pulse widths which are narrower than signals $V_{G1}$ and $V_{G2}$, and which are approximately centered within these pulses to capture the peaks more accurately.

In yet other embodiments, signals C and D are derived from signals $V_{G1}$ and $V_{G2}$ such that peak detector circuits 152 and 154 capture the peak at approximately the center of the rectangular pulses of the current through the load. Those skilled in the art will recognize that other timing schemes can be used to generate signals C and D used to drive peak detectors 152 and 154.

The peak detection circuit 152 operates as follows. When the switch UC is closed, capacitor $C_{P1}$ is charged to the level of the voltage appearing at the output $V_{SEC}$ of amplifier A1. The value of capacitor $C_{P1}$ is sufficiently high that it can hold a charge for a period which is much longer than the average period of the PWM pulses. Thus, capacitor $C_{P1}$ "remembers" the last voltage applied to it. Amplifier A4 acts as a buffer, making it possible to drive the next stage (to be explained below) without discharging capacitor $C_{P1}$. The peak detection circuit 154 operates in a similar manner.

Due to the manner of derivation of signals C and D, the two peak detection circuits measure the peak excursions of voltage during the time that the transformer turns ratio is +1:N, at the output of amplifier A1, in the positive and negative directions. The peak detection circuits detect the peaks correctly due to the fact that they are controlled by derivations of the signals $V_{G1}$ and $V_{G2}$ which control the basic H-bridge PWM circuit 100.

Flux balance error circuit 160 includes amplifier A6 and resistor $R_E$. This circuit amplifies the sum of the signals generated by amplifiers A4 and A5. To the extent that the output of amplifier A6 is nonzero, it represents any flux imbalance resulting from the DC component in the transformer. This output is fed back to secondary S1 of transformer 120 for canceling the DC component to maintain the average flux density in the core at or near zero.

There are several advantages in maintaining the flux in the transformer core at or near zero. The transformer exhibits a nonlinear relationship between current in the primary and current induced in the secondary, and this nonlinearity becomes especially pronounced at high levels of flux, when the transformer core approaches saturation. Moreover, these non-linearities are temperature-dependent. Maintaining the flux level near zero avoids or minimizes such problems. Maintaining the flux at or near zero also has the advantage that it is feasible to use a relatively small transformer to achieve relatively high linearity, thus reducing the cost of the circuit, the weight of the circuit, and the space occupied by the circuit.

FIGS. 5 and 6 illustrate alternate embodiments of circuit 130 in accordance with the invention. As shown in FIGS. 5 and 6, de-modulation circuit 160 can be implemented using a first controllable amplifier 502 and a second controllable amplifier 504. The first controllable amplifier 502 is controlled using signal A1 to multiply $V_{SEC}$ by either +1 or −1 to establish a polarity of gain applied by circuit 160. Then, second controllable amplifier 504 is controlled using signal B1 to multiply the output of the first amplifier 502 by either +1 or +3.

In the circuit shown in FIG. 5, the output of flux balance circuit 150 is provided to the secondary S1 of transformer 120 as in previous embodiments. However, as shown in FIG. 6, by inverting the output of the flux balance circuit 150 (for example using inverter 602, the same result can be achieved by providing the inverted output of the flux balance circuit to the non-inverting input of amplifier A1 of circuit 140.

While the invention has been described with respect to particular embodiments, the invention can be modified in other ways, within the scope of the disclosure. For example, the specific form of the amplifiers and switches can be varied. Also, the number of turns on primaries P1, P2, P3 and P4 can be changed, resulting in changes in the gains applied during demodulation. Such modifications, and others which will be apparent to those skilled in the art, should be considered within the spirit and scope of the following claims.

What is claimed is:

1. A current sensor for measuring load current flowing through a load driven by a dual totem power stage, the dual totem power stage having four power devices, at least two of which are controlled by pulse width modulation (PWM) control signals to change current paths of the load current, the current sensor comprising:

a transformer including a secondary winding having a number N of turns, the transformer also including a primary winding comprising four separate primary winding sections each coupled in series with a different one of the four power devices of the dual totem power stage, and wherein different ones of the four primary winding sections have different numbers of turns such that different turns ratios result between the primary winding and the secondary winding for different current paths and thus generating a modulated signal on the secondary winding; and measurement circuitry coupled to the secondary of the transformer, the measurement circuitry demodulating the modulated signal on the secondary winding to provide a load current output indicative of a level of current through the load.

2. The current sensor of claim 1, wherein the measurement circuitry provides the load current output by applying different gains to the modulated signal as a function of the turns ratio resulting from a particular current path.

3. The current sensor of claim 2, wherein the different gains applied by the measurement circuitry include different gain polarities and different gain amplitudes.

4. The current sensor of claim 3, wherein each of the four primary winding sections has a different number of turns.

5. The current sensor of claim 3, wherein the measurement circuitry further comprises:

current cancellation circuitry coupled to the secondary winding and adapted to apply a cancellation current to the secondary winding, the current cancellation circuitry receiving the modulated signal from the secondary winding and providing a voltage signal output as a function of the modulated signal; and gain stage circuitry coupled to the current cancellation circuitry and applying the different gains to the modulated signal by applying the different gains to the voltage signal.

6. The current sensor of claim 5, and further comprising flux balance circuitry coupled to the current cancellation circuitry and receiving the voltage signal from the current cancellation circuitry, the flux balance circuitry providing a feedback signal to the secondary winding as a function of the voltage signal, the feedback signal tending to minimize flux imbalance in a core of the transformer.

7. The current sensor of claim 6, wherein the flux balance circuitry is coupled directly to the secondary winding and provides the feedback signal to the secondary winding.

8. The current sensor of claim 6, wherein the flux balance circuitry is coupled to the current cancellation circuitry and wherein the current cancellation circuitry generates the cancellation current as a function of the feedback signal.

9. The current sensor of claim 2, wherein first and second ones of the four power devices are positioned on a first totem of the dual totem power stage, and wherein third and fourth ones of the four power devices are positioned on a second totem of the dual totem power stage.

10. The current sensor of claim 9, wherein the first, second, third and fourth power devices are switches.

11. The current sensor of claim 9, wherein the first and fourth power devices are switches and the second and third power devices are diodes.

12. The current sensor of claim 9, wherein first and second ones of the primary windings are positioned, respectively, in series with the first and second ones of the four power devices, and wherein the first and second ones of the four primary windings each have a number J of turns.

13. The current sensor of claim 12, wherein third and fourth ones of the primary windings are positioned, respectively, in series with the third and fourth ones of the four power devices, and wherein the third and fourth ones of the four primary windings each have a number K of turns, with the number K being different than the number J.

14. The current sensor of claim 12, wherein the different gains applied by the measurement circuitry include J+K, J−K, −J+K, and −J−K.

15. The current sensor of claim 14, wherein the number J of turns is two, and wherein the number K of turns is one such that the gains applied by the measurement circuitry include +3, +1, −1, and −3.

16. A current sensor for measuring load current flowing through a load driven by a dual totem power stage, the dual totem power stage having four power devices, at least two of which are controlled by pulse width modulation (PWM) control signals to change current paths of the load current, the current sensor comprising:

transformer means for providing galvanic isolation from the load and having a plurality of different primary winding sections each coupled in series with a different one of the four power devices of the dual totem power stage for generating a signal on a secondary winding which is modulated as a function of a path of the load current, wherein different ones of the plurality of different primary winding sections having different numbers of turns such that different turns ratios result between the primary winding and the secondary winding for different current paths; and measurement means coupled to the secondary of the transformer for demodulating the modulated signal on the secondary winding to provide a load current output indicative of a level of current through the load.

* * * * *